United States Patent [19]
Koskowich

[11] Patent Number: 5,512,857
[45] Date of Patent: Apr. 30, 1996

[54] CLASS AB AMPLIFIER ALLOWING QUIESCENT CURRENT AND GAIN TO BE SET INDEPENDENTLY

[75] Inventor: Gregory N. Koskowich, Pleasanton, Calif.

[73] Assignee: ReSound Corporation, Redwood City, Calif.

[21] Appl. No.: 343,243

[22] Filed: Nov. 22, 1994

[51] Int. Cl.$^6$ ................................................. H03F 3/45
[52] U.S. Cl. ........................................... 330/252; 330/261
[58] Field of Search ................................... 330/252, 255, 330/257, 261; 381/120

[56] References Cited

U.S. PATENT DOCUMENTS

| | | | |
|---|---|---|---|
| 4,321,428 | 3/1982 | Seki | 330/252 X |
| 4,378,530 | 3/1983 | Garde | 330/267 X |
| 4,868,517 | 9/1989 | Waldhauer et al. | 330/254 |
| 4,882,762 | 11/1989 | Waldhauer | 381/106 |
| 5,278,912 | 1/1994 | Waldhauer | 381/68.4 |
| 5,285,172 | 2/1994 | Okanobu et al. | 381/120 X |

*Primary Examiner*—Steven Mottola
*Attorney, Agent, or Firm*—Burns, Doane, Swecker & Mathis

[57] ABSTRACT

Topologies for Class AB amplifiers which have reduced quiescent power consumption are disclosed. An exemplary amplifier according to the present invention comprises two transconductance amplifying cells, each having an output transistor. Each output transistor is biased such that it conducts a small quiescent current which is preferably sufficient in magnitude to reduce amplifier distortion. The class AB amplifiers are well suited for low power supply voltage applications, such as hearing aids.

22 Claims, 4 Drawing Sheets

CLASS AB AMPLIFIER ALLOWING QUIESCENT CURRENT AND GAIN TO BE SET INDEPENDENTLY

FIELD OF THE INVENTION

This invention relates to the field of audio signal processing and specifically to an improved amplifier circuit for hearing aid applications.

BACKGROUND OF THE INVENTION

In the field of audio signal processing generally and in hearing aid applications in particular, a need exists to manufacture miniaturized audio components such as amplifiers, compressors, expanders and filters. Because of the complexity of the functions provided by these devices, it is difficult to manufacture these circuits in a topology which functions reliably at power supply voltages as low as 1 volt. Today, many audio devices are being designed to operate at very low voltages. Operation at low voltages allows these devices to be powered by a single cell battery. However, operation from a single cell battery severely limits the amount of total power available to the circuitry powered therefrom. Therefore, it is desirable to design low voltage circuitry wherein the current consumption and power dissipation of the circuitry are minimized.

Class AB amplifiers are well known devices which are used for low power and low voltage audio applications such as hearing aids. Although other types of amplifiers, such as Class A and Class B amplifiers, have been used for various audio applications, Class AB amplifiers are superior to Class A amplifiers in minimizing power consumption and are superior to Class B amplifiers in minimizing crossover and harmonic distortion. However, the typical drawback of prior art Class AB amplifiers is a tradeoff between reducing quiescent power dissipation and distortion and available output power. Known prior art designs fall short of reducing power dissipation and distortion to a minimum while maintaining the required output power capability.

Figure 1:
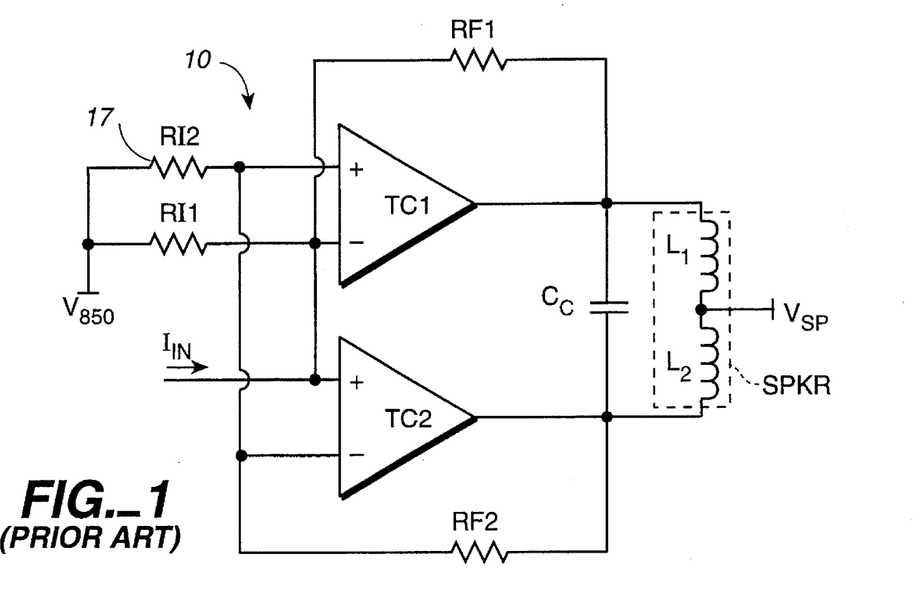
FIG. 1 is a schematic diagram of a class AB amplifier according to the prior art.
Figure 2:
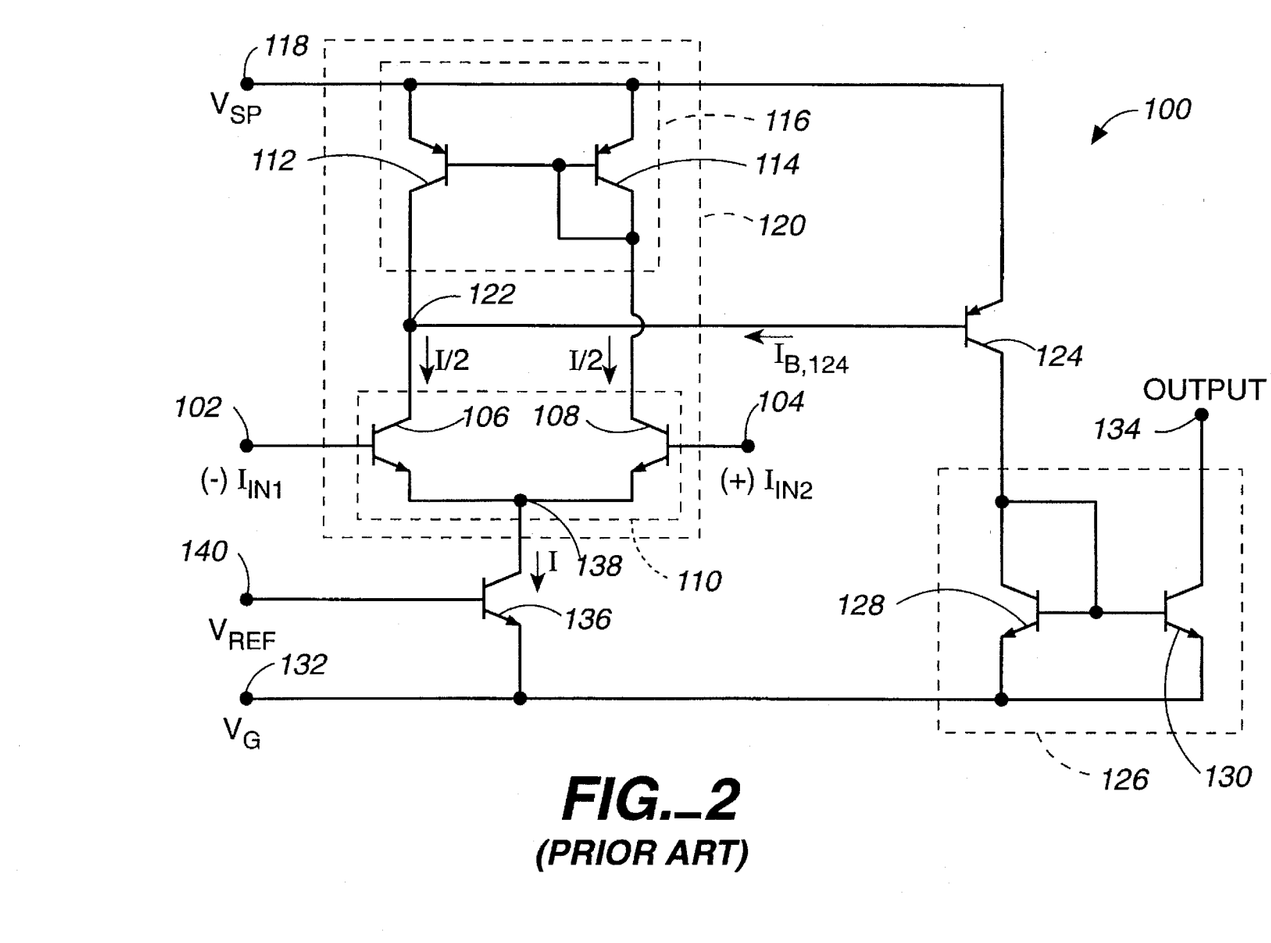
FIG. 2 is a schematic diagram of a class AB transconductance cell according to the prior art which is used in the prior art class AB amplifier shown in FIG. 1.

One prior art amplifier that is designed to achieve both of the competing goals of reducing quiescent power dissipation and maintaining gain within the limitations required of a hearing aid application is employed in the following hearing aid devices manufactured by Resound Corporation: the ED3 series, the BT2 series, and the BTP series. This amplifier is depicted in FIGS. 1 and 2, and has a symmetrical configuration of transistors and other discrete components which are ideally matched to each other. More specifically, both the transconductance (voltage amplification) portion and the driver portion of the topology employ current mirror configurations. This design effectively reduces quiescent current consumption typical of other prior art designs by over 50%.

Although the amplifier shown in FIGS. 1 and 2 improves upon other prior art amplifiers by maintaining gain characteristics of the amplifier while reducing power dissipation, its design still forgoes some improvement in power consumption in achieving its goal. This is so because the quiescent current cannot be independently controlled from the current gain of the circuit. It is therefore desirable to design an amplifier in which the quiescent current can be set independently from the circuit gain. By structurally decoupling the quiescent current from the gain components of the circuit, a low power-high gain amplifier can better accommodate the power and size limitations of hearing aid applications.

It is therefore an object of the present invention to provide an amplifier in which the power consumption is reduced to a level lower than achieved in the prior art while maximizing the gain performance of the amplifier.

It is also an object of the invention to provide an amplifier in which quiescent current is set independently of the overall gain of the amplifier.

It is still a further object of the present invention to provide an amplifier which minimizes crossover distortion.

SUMMARY OF THE INVENTION

The present invention encompasses novel amplifying cells and topologies for Class AB amplifiers which overcome the drawbacks of prior art designs and achieve the aforesaid advantages. Broadly stated, an amplifying cell according to the present invention has a first input for receiving a first input signal, a second input for receiving a second input signal, and an output. Additionally, the amplifying cell comprises an output transistor having a first conduction terminal coupled to the output of the cell, a second conduction terminal coupled to a first source of potential, and a control terminal controlling the flow of current between the first and second conduction terminals. The amplifying cell further comprises a differential amplifying network which includes a first input coupled to the first signal, a second input coupled to the second input signal, and an output coupled to the control terminal of the output transistor. An input signal difference between the level of the first input signal and the level of the second input signal appears across the inputs of the amplifying network. The amplifying network generates a current signal at its output as a function of the input signal difference when the input signal difference is positive, and substantially generates a substantially lower current signal at its output as a function of the difference when the difference is substantially negative. Moreover, the amplifying network further generates a quiescent output current at its output when the input signal difference is substantially zero, with the quiescent current generating a quiescent output current in first conduction terminal of the output transistor. The amplifying network further comprises a bias network for generating a bias current and coupling the bias current to the control terminal of the output transistor such that the quiescent output current of the output transistor may be set to a desired value which reduces quiescent current consumption.

BRIEF DESCRIPTION OF THE DRAWINGS

FIG. 4 is a schematic diagram of a second embodiment of a class AB transconductance cell according to the present invention.

DETAILED DESCRIPTION OF THE INVENTION

FIG. 1 shows a schematic diagram of a class AB amplifier 10 according to the prior art suitable for hearing aid applications. Amplifier 10 receives an input current signal $I_{IN}$ and drives a hearing aid speaker SPKR, which includes two series connected inductors (e.g., coils) $L_1$ and $L_2$, which are magnetically coupled to one another and have a mutual inductance. Amplifier 10 comprises two transconductance cells TC1 and TC2, two input resistors RI1 and RI2, two feedback resistors RF1 and RF2, and a frequency compensation capacitor $C_{COMP}$. Each transconductance cell comprises an inverting input (−), a non-inverting input (+), and an output, and generates a current at its output which is a function of the voltage difference at its inputs when the voltage at the non-inverting input (+) is greater than the voltage at the inverting input (−). When the voltage at the non-inverting input (+) is less than the voltage at the inverting input (−), the transconductance cell generates substantially less current or substantially no current at its output.

Cells TC1 and TC2 are configured to amplify respective half-cycles of the input current signal $I_{IN}$. The input signal $I_{IN}$ is coupled to one terminal of resistor RI1 to generate a voltage across resistor RI1 which is substantially proportional to the input current $I_{IN}$. The other terminal of resistor RI1 is coupled to an 850 mV reference voltage $V_{850}$. Resistor RI1 is also coupled to the inverting input (−) of cell TC1 and the non-inverting input (+) of cell TC2 to provide the proportional voltage to the cells. The other inputs of cells TC1 and TC2 are coupled to the reference voltage $V_{850}$ through a resistor RI2, which preferably has a resistance substantially equal to the resistance of RI1. With this coupling, cell TC2 amplifies the positive half-cycles of the input current $I_{IN}$ and cell TC1 amplifies the negative half-cycles. Resistor RF1 is coupled between the output and inverting input (−) of cell TC1 to provide negative feedback for cell TC1, and resistor RF2 is coupled between the output and inverting input (−) of cell TC2 to provide negative feedback for cell TC2. Feedback resistors RF1 and RF2 preferably have substantially equal resistances. The outputs of the cells are coupled to the speaker SPKR at respective terminals of its coils $L_1$ and $L_2$, which are fed with power from a supply $V_{SP}$ at their common connection node. In modern hearing aids, supply $V_{SP}$ is typically between 1.15 V and 1.5 V. Capacitor $C_{COMP}$ is also coupled to speaker SPKR at respective coils $L_1$ and $L_2$. In a conventional fashion, cell TC2 energizes coil $L_2$ on the positive half-cycles of the input current signal $I_{IN}$, and cell TC1 energizes coil $L_1$ on the negative half-cycles of the input current signal $I_{IN}$. By amplifying on opposing polarities of the input signal, cells TC1 and TC2 operate in phase opposition and, as such, collectively comprise a push-pull, or balanced, amplifier.

FIG. 2 shows a schematic diagram of a prior art transconductance cell 100 suitable for cells TC1 and TC2 of class AB amplifier 10. Cell 100 receives an input voltage signal between an inverting input terminal 102 and non-inverting input terminal 104, which are coupled to the base terminals of two NPN transistors 106 and 108, respectively. As is known in the art, there are two general types of bipolar transistors, NPN transistors and PNP transistors, with the two types being complementary. Transistors 106 and 108 are configured as an emitter-coupled differential pair 110 with their emitter terminals coupled together at a common node 138. The current through the emitters of transistors 106 and 108 is set by an NPN transistor 136, which has its collector coupled to node 138 and its emitter coupled to a ground voltage source ($V_G$) at terminal 132. The base of transistor 136 is coupled to a reference source ($V_{REF}$) at terminal 140 which sets the collector current of transistor 136 to a predetermined value.

Transistors 102 and 104 have their collector terminals coupled to a PNP current-mirror load 116 formed by two PNP transistors 112 and 114 which have substantially equal emitter areas. Transistors 112 and 114 have their base terminals coupled together and their emitter terminals coupled to a voltage supply $V_{SP}$ at terminal 118. The base and collector terminals of transistor 114 are coupled together. Any current flowing from the collector and base of transistor 114 sets a corresponding voltage across the base-emitter junction of transistor 114. This same base-emitter voltage is coupled to the base-emitter junction of transistor 112, which causes a substantially identical amount of current to flow from the collector of transistor 112, as long as transistor 112 is not in saturation and transistors 112 and 114 are at substantially the same temperature. The collector of transistor 112 is coupled to the collector of transistor 106 at output node 122. If transistors 112 and 114 do not have identical emitter areas, the amount of current in transistor 112 is scaled in proportion to the ratio of emitter areas $A_{E,112}/A_{E,114}$.

Differential pair 110 and current mirror 116 collectively comprise a differential amplifier stage 120 which generates an output current at node 122 which is a function of the voltage difference between inputs 102 and 104. The output current is coupled to the base terminal of a PNP transistor 124. When the voltages at inputs 102 and 104 are equal, the collector currents of transistors 106 and 108 are substantially equal. A voltage difference between inputs 102 and 104 causes transistors 106 and 108 to have different collector currents. The difference between these currents is generated at node 122 by current mirror 116, which duplicates the collector current of transistor 108 at the collector of transistor 112 and couples the duplicated current to the collector of transistor 106 at node 122. Since the collector current of transistor 106 is drawn from node 122 while the collector current of transistor 112 is provided to node 122, the difference between the two collector currents is generated at node 122.

When the voltage at input 102 is greater than that at input 104, the collector of transistor 106 draws more current from node 122 than is provided by the collector of transistor 112, with the difference being drawn from the base of PNP transistor 124. The amount of current drawn from the base of PNP transistor 124 increases as the voltage difference $V_{DIFF}=V_{102}-V_{104}$ increases and, as is known in the analog integrated circuits art, is approximately equal to:

$$I_{B,124} \approx I_0 \tanh\left(\frac{V_{DIFF}}{2}\right) + \frac{I_0}{2}\left(\frac{2}{\beta_P + 2}\right) \quad (1)$$

where $I_0$ is the collector current of transistor 136, tanh() is the hyperbolic tangent function, and $\beta_p$ is the beta of transistor 114, and where the approximation occurs mainly in the latter term $I_0/2*(2/(\beta_p+2))$. When the voltage at input 102 is substantially less than that at input 104, the collector of transistor 112 is capable of providing more current than the collector of transistor 106 can draw, the current difference being provided to the base of PNP transistor 124. Instead of drawing current from the base of transistor 124, transistors 112 and 106 attempt to provide current to the base of transistor 124. However, the provision of any current (i.e., $I_{B,124}$) to the base of transistor 124 is sufficient to shut off transistor 124, causing it to block substantially all current flow in its collector. With PNP transistor 124 shut off, transistor 112 goes into saturation to reduce its collector current to a level that can be drawn by transistor 106.

PNP transistor 124 has its emitter terminal coupled to voltage source terminal 118, and its collector terminal is coupled to an NPN current mirror 126 formed by two NPN transistors 128 and 130. When current is drawn from the base of PNP transistor 124, transistor 124 generates a collector current which is substantially equal to its base current multiplied by its current gain parameter ($\beta_p$). A typical range of $\beta_p$ is between 25 and 150; the range for $\beta_p$ can extend as high as 200 or more. The collector current of PNP transistor 124 is coupled to transistor 128, which mirrors the current over to transistor 130. Transistor 130 has an emitter area which is N times larger than the emitter area of transistor 128, and consequently has a collector current which is N times larger than the collector current of transistor 128. A value of N=40 is typical. The collector of transistor 130 is coupled to the audio output terminal 134 of cell 100. Transistor 124 and current mirror 126 provide an overall current gain of approximately $\beta_p N \beta_n/(\beta_n+N+1)$, where $\beta_n$ is the current gain parameter of transistors 128 and 130, and where the latter term $\beta_n/(\beta_n+N+1)$ results from the provision of base currents to transistors 128 and 130 in the current mirror. The output current of the cell, as provided at the collector of transistor 130, is therefore:

$$I_{C,134} \approx \left( I_0 \tanh\left(\frac{V_{DIFF}}{2}\right) + \frac{I_0}{2}\left(\frac{2}{\beta_P+2}\right) \right) \beta_p N \frac{\beta_n}{\beta_n+N+1} \quad (2)$$

which is the transconductance function of the cell.

The quiescent currents for the branches of circuit 100 are derived assuming that no input signal difference ($V_{DIFF}$=0) is applied at inputs 102 and 104, and that a reference voltage ($V_{REF}$) is provided at terminal 140, causing a reference current ($I_0$) to flow in the collector of transistor 136. The total quiescent current ($I_{TOT}$) of the transconductance cell 100 can be readily calculated in a conventional manner by summing the quiescent collector currents of transistors 136, 124, and 130. Since the collector current of transistor 136 is $I_0$, the quiescent collector current of transistor 124 is $\beta_p I_0/2*(2/(\beta_p+2))$, given that the differential amplifier 120 couples a quiescent current of $I_0/2*(2/(\beta_p+2))$ to the base of transistor 124. From the above transconductance function, the quiescent collector current of transistor 130 is readily identified as:

$$I_{C,134,0} = \frac{I_0}{2}\left(\frac{2}{\beta_P+2}\right) \beta_p N \frac{\beta_n}{\beta_n+N+1} \quad (3)$$

Accordingly, the total quiescent current ($I_{TOT}$) of cell 100 is:

$$I_{TOT} = I_0 + \frac{I_0}{2}\frac{2\beta_p}{\beta_p+2} + \frac{I_0}{2}\left(\frac{2\beta_P}{\beta_p+2}\right)\left(\frac{N\beta_n}{\beta_n+N+1}\right) \quad (4)$$

Assuming that $\beta_n \gg N, \beta_n \gg 1$, and $\beta_p \gg 1$, the expression can be simplified as $I_{TOT}=(N+2)I_0$.

As a point of merit, the total quiescent current $I_{TOT}$ is compared to the maximum output current $I_{OMAX}$ that can be generated at output 134. The maximum output current $I_{OMAX}$ occurs when negative voltage is applied to the base of transistor 108 with respect to the base of transistor 106 having a sufficient magnitude to render transistor 108 substantially non-conductive. With transistor 108 non-conductive, all of the current $I_0$ set by transistor 136 flows through transistor 106, and no current is coupled to current mirror 116. Consequently, the current from the collector of transistor 112 is substantially zero, leaving transistor 106 to draw the current $I_0$ from the base of transistor 124. As stated above, PNP transistor 124 and current mirror 126 provide an overall current gain of approximately $\beta_p N \beta_n/(\beta_n+N+1)$. Therefore, assuming that transistors 106, 124, and 128 do not saturate, the maximum output current $I_{OMAX}$ equals $I_0 \beta_p N \beta_n/(\beta_n+N+1)$, which can be approximated as:

$$I_{OMAX} \approx I_0 \beta_p N \text{ when } \beta_n \gg N.$$

The total quiescent current $I_{TOT}=(N+2)I_0$ may be rewritten as a function of $I_{OMAX}$ as follows:

$$I_{TOT}=I_{OMAX}/\beta_p+2I_0.$$

To meet acceptable amplification, distortion, and signal-to-noise specifications for a hearing aid application, the currents $I_0$ and $I_{OMAX}$ are set to the following values: $I_0$=5 µA and $I_{OMAX}$=7 mA. The ratio N for the output current mirror is then determined as $N=I_{OMAX}/(\beta_p I_0)$. For typical betas of $\beta_p$=35 and $\beta_n$=125, N is equal to N=40. The total quiescent current is then calculated to be approximately equal to 210 µA. For two transconductance cells, the resulting total quiescent current is therefore 420 µA. This is a marginally acceptable quiescent power consumption given the small power supplies that are available for use in hearing aid devices, and should therefore be reduced. Unfortunately, the topology of cell 100 only allows the circuit designer to vary the parameters N and $I_0$ to meet the design requirements. There is no other independent variable which can be varied to lower the power consumption, while maintaining the required amplification, distortion, and signal-to-noise ratio requirements.

Figure 3:
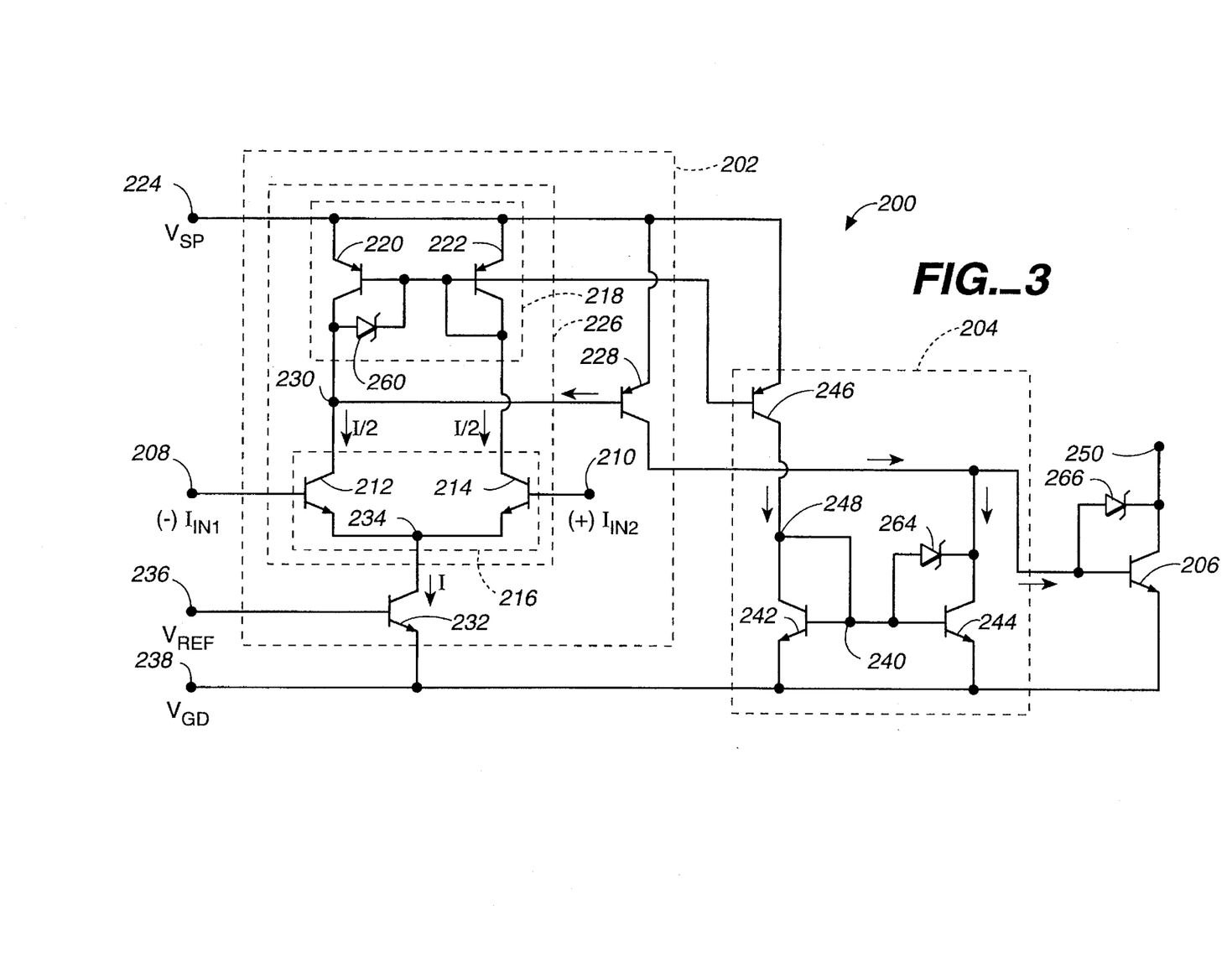
FIG. 3 is a schematic diagram of a first embodiment of a class AB transconductance cell according to the present invention.

FIG. 3 shows a schematic diagram at 200 of a first embodiment of a transconductance cell for a Class AB amplifier, according to the present invention, which consumes less quiescent current than the prior art cell shown in FIG. 2. Transconductance cell 200 may be employed in amplifier 10 shown in FIG. 1, or in an amplifier 20 according to the present invention shown in FIG. 5, which is described below in greater detail.

Referring back to FIG. 3, the transconductance cell 200 comprises a gain network 202, an output transistor 206, and a biasing network 204. Output transistor 206 preferably comprises a bipolar transistor having two conduction terminals (emitter and collector) and a control terminal (base) for controlling the flow of current between the conduction terminals. Biasing network 204 enables the quiescent current in output transistor 206 to be set substantially independently of the gain of cell 200, while not significantly impacting the gain of cell 200. The transconductance cell 200 receives an audio input signal ($I_{IN1}$) at an inverting input 208 and another audio input signal ($I_{IN2}$) a non-inverting input 210, and provides an output current at an audio output terminal 250. The inputs 208 and 210 are provided to gain network 202, which has an output coupled to the base of output transistor 206. Biasing network 204 has an output that is also coupled to the base of transistor 206. The emitter terminal of output transistor 206 is coupled to a ground voltage source ($V_{SP}$) at a terminal 238, and the collector terminal of transistor 206 is coupled to audio output terminal 250.

Gain network 202 comprises a differential amplifier 226, an NPN transistor 232 which sets the quiescent current in differential amplifier 226, and a gain stage comprising a PNP transistor 228. Differential amplifier 226 has inputs which are coupled to input 208 and 210, and an output 230 which is coupled to the base of gain stage transistor 228. Differential amplifier 226 comprises two transistors 212 and 214 having their base terminals coupled to inputs 208 and 210, respectively. Transistors 212 and 214 are configured as an emitter-coupled differential pair 216, with their emitter terminals coupled to a common-emitter node 234. The total current through the emitters of transistors 212 and 214 is set by NPN transistor 232, which has its collector coupled to node 234 and its emitter coupled to voltage ground source ($V_{GD}$) at terminal 238. The base of transistor 232 is coupled to a reference source ($V_{SP}$) at terminal 236 which sets the collector current of transistor 232 to a value of $I_0$ as long as transistor 232 remains out of saturation mode.

Differential amplifier 226 further comprises a current-mirror load 218 having two PNP transistors 220 and 222. Transistors 220 and 222 have their base terminals coupled together and their emitter terminals coupled to a voltage supply ($V_{SP}$) at terminal 224. The base and collector terminals of transistor 222 are coupled together, which causes the current flowing in transistor 222 to be mirrored in transistor 220. Differential pair transistors 212 and 214 have their collector terminals coupled to the collectors of transistors 220 and 222, respectively. Under normal operating conditions, the current in transistor 214 sets the current in mirror transistor 222, which in turn sets the current in transistor 220. Any current flowing in transistor 222 is mirrored in transistor 220 as a function of the relative sizes (i.e., emitter areas) of transistors 220 and 222. In a preferred embodiment, transistors 220 and 222 have sizes that are substantially equal.

Differential amplifier 226 is similar in construction to differential amplifier 120 shown in FIG. 2, operates in a similar manner, and has a similar transconductance gain characteristic. When the voltages at inputs 208 and 210 are equal and above approximately 0.825 V ($V_{BE(ON)}V_{CE(SAT)}$), which are quiescent input signal conditions, the current $I_0$ set by transistor 232 is split substantially equally between transistors 212 and 214. Under these conditions, transistor 212 draws a current of ($I_0/2$) from node 230. At the same time, current mirror 218 couples a current of approximately $(I_0/2)*(\beta_p/(\beta_p+3))$ to node 230. The factor $\beta_p/(\beta_p+3)$ is due to the base currents of transistors 220, 222, and 246, the latter transistor being part of biasing network 204 which is described below. Under quiescent conditions, a difference in current of $(I_0/2)*(3/(\beta_p+3))$ is drawn from the base of transistor 228 by transistor 212 to balance the current at node 230.

Transistor 228 comprises an intermediate gain stage, and operates in a similar manner as transistor 124 shown in FIG. 2. The emitter terminal of transistor 228 is coupled to the voltage supply at terminal 224, and its collector terminal is coupled to the base of output transistor 206. Transistor 228 generates a current in its collector which is substantially equal to its current gain parameter $\beta_p$ times the current drawn at output node 230 due to the current imbalance between transistors 212 and 220. Under quiescent conditions, transistor 228 has a quiescent collector current of $\beta_p*(I_0/2)*(3/(\beta_p+3))$, which is approximately equal to $(3/2)*\beta_p I_0$, when $\beta_p>>3$. This quiescent current of network 202 increases with a higher preset gain and decreases if the gain is at a lower preset value.

Without biasing network 204, the entire quiescent current $(3/2)\beta_p I_0$ of transistor 228 would flow into the base of transistor 206, causing a quiescent collector current in transistor 206 of approximately $(3/2)*\beta_p\beta_n I_0$, which is much larger than the total quiescent current in gain network 202, which is approximately $(3/2)*\beta_p I_0+I_0$. With biasing network 204 in place, however, a substantial portion of the quiescent current of transistor 228 is diverted away from the base of transistor 206, thereby reducing the quiescent current of transistor 206. In effect, the bias current of network 204 cancels a portion of the quiescent collector current of transistor 228.

As seen from the following discussion, a key feature of bias network 204 is that the amount of quiescent current it diverts away from transistor 206 is adjustable independent of the gain of cell 200. This is accomplished by adjusting the relative emitter areas of the transistors in bias network 204.

In a preferred embodiment, as seen below, a second key feature of biasing network 204 is that it further comprises means for decreasing the amount of diverted current as a function of the input signal provided at the inputs of cell 200, which further minimizes its effects on the cell's gain.

Biasing network 204 comprises a PNP transistor 246, and a current mirror 240, which comprises two NPN transistors 242 and 244. Transistors 242 and 244 have their base terminals coupled together and their emitter terminals coupled to the ground voltage source ($V_{GD}$) at terminal 238. The base and collector terminals of transistor 242 are coupled together, which causes the current flowing in transistor 242 to be mirrored in transistor 244. The current flowing in mirror transistor 242 is set by PNP transistor 246, which has its collector coupled to the collector of transistor 242 and its emitter coupled to the voltage supply source ($V_{SP}$) at terminal 224. The base of transistor 246 is coupled to the base of mirror transistor 222 (of amplifier 226), which sets the current flow in transistor 246. The current flowing in transistor 222 is mirrored in transistor 246 as a function of the relative emitter areas of transistors 222 and 246. Likewise, current flowing in transistor 242 is mirrored in transistor 244 as a function of the relative emitter areas of transistors 242 and 244. The collector of transistor 244 is coupled to the base of output transistor 206.

In one embodiment of the present invention, transistors 222 and 246 have sizes that are substantially equal, and transistor 244 has a size that is approximately three times the size of transistor 242. Under quiescent conditions (i.e., no input signal), transistor 222 sets a quiescent current of $I_X=(I_0/2)*(\beta_p/(\beta_p+3))$ flowing from the collector of transistor 246. This current is coupled to the current mirror comprising transistors 242 and 244, and is divided between the collector of transistor 242 and the bases of transistors 242 and 244. A fraction $I_X/(\beta_n+4)$ goes to the base of transistor 242, a fraction $3I_X/(\beta_n+4)$ goes to the base of transistor 244, and the remaining fraction $I_X\beta_n/(_n+4)$ goes to the collector of transistor 242. The fraction $3I_X/(\beta_n+4)$ going to the base of transistor 244 generates a quiescent collector current of $3\beta_n I_X/(\beta_n+4)$ in transistor 244. Subtracting the quiescent current 3 $\beta_n I_X/(\beta_n+4)$ of transistor 244 from the quiescent current $\beta_p*(I_0/2)*(3/(\beta_p+3))$ of transistor 228 leaves a quiescent current of $\beta_p*(I_0/2)*(3/(\beta_p+3))*(4/(\beta_n+4))$ which flows to the base of transistor 206, and generates a quiescent current of $\beta_n\beta_p*(I_0/2)*(3/(\beta_p+3))*(4/(\beta_n+4))$ in the collector of transistor 206. Assuming $\beta_p>>3$ and $\beta_n>>4$, the quiescent collector current simplifies to $6I_0$, which is much less than the quiescent current $(3/2)*\beta_p\beta_n I_0$ that would flow without bias network 204.

The total quiescent $I_{TOT}$ current can be obtained by adding the above-calculated quiescent current to the quiescent collector currents of transistors 246, 228, and 232. With the same assumptions for $\beta_p$ and $\beta_n$, the expressions for the other quiescent currents simplify as follows:

collector of transistor 246 $I_0/2$ collector of transistor 228 $(3/2)*I_0$ collector of transistor 232 $I_0$ giving a total quiescent current of approximately $I_{TOT}=9I_0$ when added with the $6I_0$ in the collector of output transistor 206. This is much less than the quiescent current of $(N+2)I_0$ for the circuit of the prior art circuit of FIG. 2, assuming the same values for $I_0$ and N=40.

As with cell 100, the maximum output current $I_{OMAX}$ that can be generated at output 250 of cell 200 can be calculated.

The maximum output current $I_{OMAX}$ occurs when negative voltage is applied to the base of transistor 214 with respect to the base of transistor 212 having a sufficient magnitude to render transistor 214 substantially non-conductive. With transistor 214 non-conductive, all of the current $I_0$ set by transistor 232 flows through transistor 212, and no current is coupled to current mirror 218. Consequently, the current from the collector of transistor 220 is substantially zero, leaving transistor 212 to draw the current $I_0$ from the base of transistor 228. Assuming transistor 212 and 228 do not saturate, the current $I_0$ drawn from the base of transistor 228 generates a current in the collector of transistor 228 which is approximately equal to $\beta_p I_0$, assuming $\beta_p \gg 1$. The current $\beta_p I_0$ is coupled to the base of output transistor 206 and to the output of bias network 204. Because no current is coupled to current mirror transistor 222, no current flows in transistor 246, and in turn no current flows in transistors 242 and 244. Accordingly, all of the current flowing from transistor 228 is coupled to the base of transistor 206, which causes a maximum collector current of $I_{OMAX} = \beta_n \beta_p I_0$ to flow in transistor 206, and to output 250, assuming transistor 206 does not saturate. The total quiescent current may be expressed as a function of $I_{OMAX}$: $I_{TOT} = 9 I_{OMAX} / (\beta_n \beta_p)$.

Setting $I_0$ to 5 µA, $\beta_p$ to 35 and $\beta_n$ to 125, as was done in the above example for the prior art cell shown in FIG. 2, gives an $I_{TOT} = 45$ µA and $I_{OMAX} = 21.9$ mA. Compared with the prior art circuit of FIG. 2, where $I_{TOT} = 210$ µA and $I_{OMAX} = 7$ mA, this exemplary embodiment of transconductance cell 200 consumes approximately one-fifth the quiescent current (an ~80% reduction) and provides over three times the maximum output current.

As stated above, when the voltage input signal at input port 208 is raised with respect to the voltage input signal at input port 210, the current flowing through the collector of transistor 222 decreases. As a result, the collector current of transistor 246 in bias network 204 decreases proportionately. The amount of current that transistor 244 of bias network 204 diverts from the base of output transistor 206 therefore decreases as the input signal difference increases. This reduction enables cell 200 to attain its maximum gain and output current ($I_{OMAX} = \beta_n \beta_p I_0$).

In a further embodiment, cell 200 comprises a schottky barrier diode 260 coupled between the base and collector of transistor 220, a schottky barrier diode 264 coupled between the base and collector of transistor 244, and a schottky barrier diode 266 coupled between the base and collector of transistor 206. These schottky barrier diodes keep their respective transistors from saturating, which might cause significant time delays when the transistors switch out of the saturation region. Such delays can increase the harmonic distortion of the amplifier. Accordingly, schottky diodes 260, 264 and 266 reduce harmonic distortion of the amplifier and improve the fidelity of the amplified signal.

FIG. 4 shows a schematic diagram at 300 of a second embodiment of a transconductance cell for a Class AB amplifier according to the present invention. Transconductance cell 300 may be employed in amplifier 10 shown in FIG. 1, or in an AB amplifier 20 according to the present invention shown in FIG. 5. Transconductance cell 300 consumes less quiescent current than the prior art circuit shown in FIG. 2, and may be configured, by appropriately choosing component values, to consume less quiescent current than transconductance cell 200 shown in FIG. 3.

Cell 300 receives a first voltage input signal at an inverting input port 310 and a second voltage input signal at a non-inverting input port 312, and provides an output signal at an output terminal 348. Cell 300 comprises the gain network 202, output transistor 206, and voltage sources $V_{SP}$, $V_{REF}$, and $V_{GD}$ at terminals 224, 236, and 238, respectively, of cell 200, which are described above. The collector of output transistor 206 is coupled to output terminal 348. Gain network 202 has its inputs coupled to inputs 310 and 312, and its output (at the collector of transistor 228) coupled to the base of output transistor 206 at a node 360.

Cell 300 further comprises a biasing network 304 coupled to the base of output transistor 206 at node 360, and a trim resistor network 308 coupled to the current-mirror load 218 of gain network 202, as described in greater detail below. Biasing network 304 enables the quiescent current in output transistor 206 to be adjusted over a relatively large range, while not significantly impacting the gain of cell 300. Trim resistor network 308 enables the amount of quiescent current coupled to output transistor 206 by gain network 202 to be adjusted without significantly impacting the gain of cell 300.

Biasing network 304 comprises an NPN transistor 350, a resistor 354, and a current mirror 352 comprising two PNP transistors 356 and 358. Transistors 356 and 358 have their base terminals coupled together, and their emitter terminals coupled to voltage supply source $V_{SP}$ at terminal 224. The base and collector terminals of transistor 356 are coupled together, which causes the current flowing in transistor 356 to be mirrored in transistor 358. The current flowing in mirror transistor 356 is set by NPN transistor 350 and resistor 354. Transistor 350 has its collector coupled to the collector of mirror transistor 356, and its emitter coupled voltage ground source $V_{GD}$ at terminal 238 by way of resistor 354. Resistor 354 enables transistor 350 to reliably generate a small and stable collector current. The current from transistor 358 is coupled to the base of output transistor 206 to maintain transistor 206 in an on state (i.e., the active forward region) at all times during operation. Delays in increasing the current in transistor 206 as a response to amplifying the input signal during the appropriate half-cycle are thereby significantly reduced, which in turn reduces signal distortion.

In one embodiment of the present invention, the emitter areas of transistors 350, 356, and 358 and the resistance of resistor 354 are selected such that the collector of transistor 358 couples a current of around 30 µA/$\beta_n$ to the base of output transistor 206, where $\beta_n$ is the current gain of output transistor 206. This component of base current causes a quiescent current component of 30 µA in output transistor 206.

Resistor trim network 308 couples the emitters of transistors 220 and 222 of differential amplifier 226 to voltage supply source $V_{SP}$ at terminal 224. Trim network 308 comprises a resistor 380 coupling the emitter of transistor 220 to supply source $V_{SP}$ at terminal 224, a group of serially-connected resistors 381–386 coupling the emitter of transistor 222 to voltage supply source at terminal 224, and a set of fusible conductive links 391–396, each being coupled in parallel with a respective one of resistors 381–386. Links 391–396 are selectively broken to provide a desired amount of resistance between the emitter of transistor 222 and supply 224. As before, the current in transistor 222 is mirrored by transistor 220. The resistance seen by the emitter of transistor 222 is chosen to reduce the amount of current to be drawn from the base of transistor 228 in comparison to the amount drawn in cell 200 shown in FIG. 3, which, in turn, reduces the amount of quiescent current that the collector of transistor 228 provides to the base of output transistor 206. The quiescent collector current in output transistor 206 that is generated from the quiescent current from transistor 228 is thereby reduced by the emitter resistance. Also, the emitter resistance generally causes the quiescent collector current of transistor 220 to be closer in value to the quiescent collector current of transistor 212 than it is in cell 200.

In cell 200 shown in FIG. 3, the quiescent collector current of transistor 220 is less than the quiescent collector current of transistor 212 by a factor of approximately $I_0/(\beta_p+2)$ due to the base currents of transistors 220 and 222 flowing into the collector of transistor 214. In cell 300 shown in FIG. 4, resistor trim network 308 enables the base-emitter voltage provided to transistor 220 by mirror transistor 222 to be increased by an amount which causes transistor 220 to increase its collector current by approximately $I_0/(\beta_p+2)$. Assuming that transistors 220 and 222 have the same emitter areas and device parameters, the increased base-emitter voltage for transistor 220 can be accomplished by setting the resistance provided by resistors 381–386 and links 391–396 to be greater than the resistance of resistor 380. If transistors 220 and 222 do not have the same emitter areas and device parameters, the resistance of resistors 381–386 and links 391–396 may be set at a different value to provide the increased current, the set resistance value possibly being less than or equal to the resistance of resistor 380.

In one embodiment of the present invention, the resistance provided by resistors 381–386 and links 391–396 is selected to cause a total quiescent collector current of around 60 µA in output transistor 30. Assuming that bias network 304 causes around 30 µA of the 60 µA, as described above, the collector current of transistor 228 is set at around 30 $\mu A/\beta_n$, where $\beta_n$ is the current gain of output transistor 206. The base current of transistor 228 is then set at a value around 30 $\mu A/(\beta_n\beta_p)$, where $\beta_n$ is the current gain of transistor 228. Assuming maximum beta values of $\beta_n=125$ and $\beta_p=35$ as a basis of comparison with cells 100 and 200, transistor 228 would ideally have a collector current of approximately 0.24 µA and a base current of approximately 7 nA. However, these are relatively low current values and, because the current gain parameters $\beta_n$ and $\beta_p$ in many real bipolar transistors decrease in value from their maximum values as the transistor's collector current decreases, the maximum beta values should not be used for real devices under these low current conditions. More realistically, approximately 60% of the beta values should be used for such devices, resulting in a collector current of approximately 0.4 µA and a base current of approximately 20 nA for transistor 228.

The total quiescent current for cell 300 may be calculated by adding the quiescent collector currents of transistors 232, 356, 358, 228, and 206. For equal comparisons with cells 100 and 200, a collector current of $I_0=5$ µA is assumed for transistor 232. From the preceding description, the quiescent collector current of transistors 228 and 206 were set at 0.4 µA and 60 µA, respectively. Assuming equal emitter areas for transistors 356 and 358 and a low current beta of 75 for output transistor 206, each of transistors 356 and 358 has a quiescent collector current of approximately 30 µA/75 =0.4 µA, giving a total quiescent current of $I_{TOT}=66.2$ µA. Compared with the prior art cell shown in FIG. 2, where $I_{TOT}=210$ µA, this exemplary embodiment of cell 300 consumes approximately one-third the quiescent current (a ~69% reduction). In comparison with the above exemplary embodiment of cell 200 shown in FIG. 3, where $I_{TOT}=45$ µA, the current consumption for this exemplary embodiment of cell 300 is 47% higher. However, the current consumption occurs mainly in the collector of output transistor 206, which may be readily reduced to a level such that the total quiescent current is comparable to, or lower than, that of the above exemplary embodiment of cell 200.

The maximum output $I_{OMAX}$ for cell 300 is substantially the same as for cell 200, namely $I_{OMAX}=\beta_n\beta_pI_0$. In preferred embodiments of cells 200 and 300, the quiescent current of output transistor 206 is set to a value between 0.025% and 2% of $I_{OMAX}$, and more preferably between 0.05% and 1% of $I_{OMAX}$. For low power hearing aid applications, the quiescent collector current of the output transistor is set to a value between approximately 10 µA and 100 µA. The quiescent base current of output transistor 206 preferably sets the base-emitter voltage of transistor 206 in the range of 0.55 V to 0.68 V, and more preferably in the range of 0.60 V to 0.65 V.

Although exemplary transistors having beta values of $\beta_n=125$ and $\beta_p=35$ have been employed in the exemplary embodiments of cells 200 and 300, such values are not critical to the present invention, and transistors having different beta values may be used. For example, transistors having beta values $\beta_n=70$ and $\beta_p=80$ have been employed in exemplary embodiments of cells 200 and 300.

In a further embodiment, cell 300 comprises a schottky barrier diode 260 coupled between the base and collector of transistor 220, and a schottky barrier diode 266 coupled between the base and collector of transistor 206. The schottky barrier diodes keep their respective transistors from saturating, which might cause significant time delays when the transistors switch out of the saturation region. Such delays can increase the harmonic distortion of the amplifier. Accordingly, the schottky diodes reduce harmonic distortion of the amplifier and improve the fidelity of the amplified signal.

There are number of approaches that may be used to break fuse links 391–396 to provide the desired amount of resistance in trim network 308. As a first approach, cell 300 is set under quiescent input signal conditions with the collector current of transistor 206 being measured. To measure the collector current, a resistor of known value may be coupled between the collector 206 and the supply voltage 224, and the voltage across the resistor may be measured to determine the current. With none of the fuse links broken, the output current will typically be at a relatively high value (e.g., several mA's). One link at a time is broken, and the resulting output current is measured. The output current generally decreases when a link is broken. As the output current decreases, the collector currents of PNP transistors 220 and 222 generally become closer in value. When the collector currents in transistors 220 and 222 are close to one another under quiescent input conditions, the following approximate relationship holds:

$$I_{C,220} \approx I_{C,222}\left(\frac{I_{C,222}R_2 + V_T}{I_{C,222}R_1 + V_T}\right)$$

where $V_T$ is the thermal voltage and the transistors have equal emitter areas and device parameters. This relationship may be used in determining which resistance values may be used and which fuses should be broken. The resistors 381–386 may have binary weighted values (e.g., 600 ohms, 300 ohms, 150 ohms, 75 ohms, etc.), or may have equal values with one of the resistors having a value near the resistance of resistor 380. In one embodiment of the present invention, the resistors 381–386 have binary weighted values of approximately 640 ohms, 320 ohms, 160 ohms, 80 ohms, 40 ohms, and 20 ohms, and resistor 380 has a value of approximately 400 ohms.

As another approach, cell 300 further comprises a test probe terminal 328 coupled to the emitter of PNP transistor 220 where a probe voltage and current can be applied thereto. The probe voltage and current are adjusted to provide the desired quiescent collector current in output transistor 206. From the values of the probe voltage and current, the approximate amount of resistance can be projected. A corresponding number of links may then be broken. In a preferred approach, a fraction (e.g., one-half) of the resistance is initially programmed and a second probe test is performed to obtain a second projected resistance value. One or more links are then broken to program the second projected resistance. As an alternative, a fraction of the second projected resistance can be programmed, and a third probe test can be made to determine a third probe resistance. This iterative approach has the advantage of adapting to non-linear effects and other anomalies in the circuit parameters, and may be carried out as many times as there are fuse links.

An exemplary method for fusing links 391–396 is now described using the above exemplary binary weighted resistances of 640 ohms, 320 ohms, 160 ohms, 80 ohms, 40 ohms, and 20 ohms for resistors 381–396, respectively, and 400 ohms for resistor 380. Transistor 232 is biased so that it conducts its nominal tail current $I_0$, and the base terminals of NPN transistors 212 and 214 are connected to the analog ground voltage, $V_{850}$. Additionally, the collector of output transistor 206 is coupled to a low impedance voltage source, preferably by way of a current-sensing resistor, such that it is allowed to conducted a current up to several milli-amperes without saturating. Under these biasing conditions, each of NPN transistors 212 and 214 conducts a collector current of substantially $I_0/2$ (assuming that each does not saturate), and PNP transistor 212 conducts a collector current of substantially $I_0/2$. However, PNP transistor 220, which has its emitter coupled to resistor 380, conducts a collector current which is substantially less than $I_0/2$. As a consequence, NPN transistor 212 draw a substantial amount of current from PNP transistor 228, which in turn provides substantial current to the base of output transistor 206, causing transistor 206 to draw a collector current in the range of one to several milli-amperes.

A current substantially equal to $I_0/2$ is then coupled into probe terminal 328, and the resulting collector current of output transistor 206 is measured. If the measured collector current is above the desired quiescent current level, referred to here as $I_{LIMIT}$, then fuse 391 is blown (i.e., opened), causing resistor 381 (~640 ohms) to be coupled in series with the emitter of PNP transistor 222. If the measured collector current is below $I_{LIMIT}$, then fuse 391 is not blown (i.e., not opened).

Next, a current substantially equal to $I_0/4$ is coupled into probe terminal 328, and the resulting collector current of output transistor 206 is measured. If the measured collector current is above $I_{LIMIT}$, then fuse 392 is blown, causing resistor 382 (~320 ohms) to be coupled in series the emitter of PNP transistor 222, and in series with resistor 381 if fuse 391 was previously blown. If the measured collector current is below $I_{LIMIT}$, then fuse 392 is not blown.

Next, a current substantially equal to $I_0/8$ is coupled into probe terminal 328, and the resulting collector current of output transistor 206 is measured. If the measured collector current is above $I_{LIMIT}$, then fuse 393 is blown, causing resistor 383 (~160 ohms) to be coupled in series with the emitter of PNP transistor 222 and the corresponding resistors of any previously blown fuses. If the measured collector current is below $I_{LIMIT}$, then fuse 393 is not blown.

The above steps are repeated for fuses 394, 395, and 396 using tests currents of $I_0/16$, $I_0/32$, and $I_0/64$, respectively. If the measured collector current is above $I_{LIMIT}$, the corresponding fuse is blown, otherwise the corresponding fuse 393 is not blown. By the end of the process, the quiescent collector current of transistor 206 will be sufficiently close to the desired value of $I_{LIMIT}$. In this exemplary embodiment, the resistance of resistor 381 (~640 ohms) is larger than that of resistor 380 (400 ohms) so as to readily accommodate any difference in characteristic parameters (e.g., $I_0$, $A_E$, $\beta$) between PNP transistors 220 and 222, and any difference in characteristic parameters between NPN transistors 212 and 214.

Figure 5:
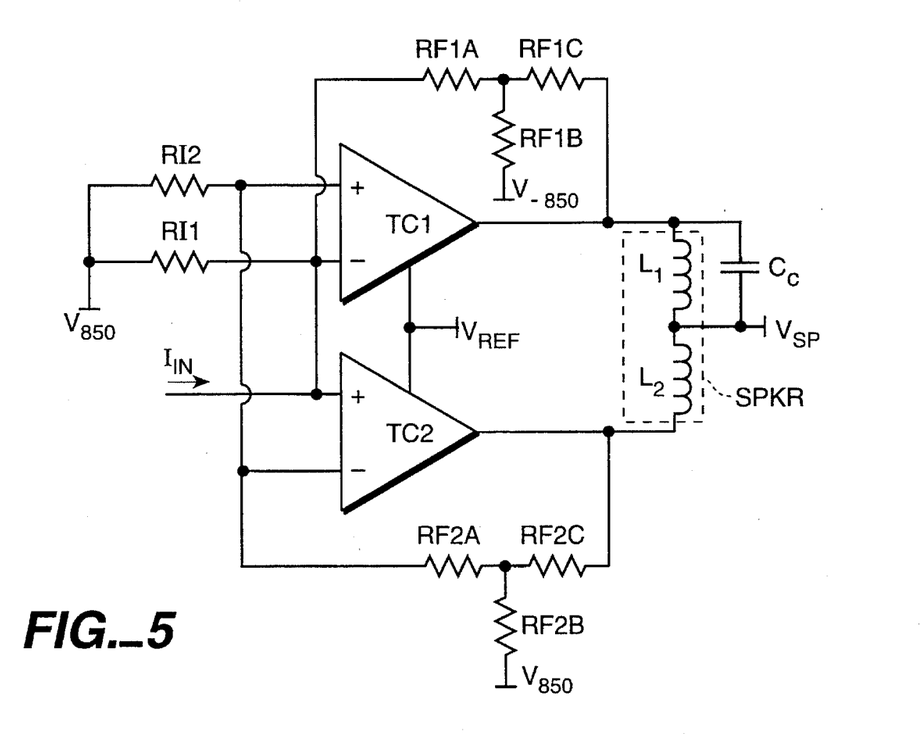
FIG. 5 is a schematic diagram of a class AB amplifier according to the present invention.

FIG. 5 shows a schematic diagram of a class AB amplifier 20 according to the present invention suitable for hearing aid applications. Like amplifier 10 shown in FIG. 1, amplifier 20 receives an input current signal $I_{IN}$ and drives a hearing aid speaker SPKR, which includes two series connected coils $L_1$ and $L_2$. With the exception of feedback resistors RF1 and RF2 and capacitor $C_{COMP}$, amplifier 20 comprises the same elements as amplifier 10 coupled to one another in substantially the same way. In place of feedback resistors RF1 and RF2, amplifier 20 includes two networks of three resistors each, as shown in FIG. 5. Feedback resistors RF1A–RF1C of amplifier 20 replace feedback resistor RF1 of amplifier 10, and the feedback resistors RF2A–RF2C of amplifier 20 replace feedback resistor RF2 of amplifier 10. The feedback networks enable the feedback currents to be generated more accurately when using IC fabrication lines which do not have good control of the resistance of high-valued resistors. In one embodiment, each of RF1A and RF2A has a resistance of 10K ohms, each of RF1B and RF2B has a resistance of 800 ohms, each of RF1C and RF2C has a resistance of 20K ohms, and each of RI1 and RI2 has a resistance of 5K ohms. When using an IC fabrication line which enable good control of resistance values, a single feedback resistor may be used in place of each feedback network, as shown in FIG. 1. For the above embodiment, such a single resistance may have a value of approximately 280K ohms.

In place of compensation capacitor $C_{COMP}$ of amplifier 10 shown in FIG. 1, amplifier 20 (FIG. 5) comprises a compensation capacitor $C_C$ coupled between the output of cell TC1 and a reference potential, such as that provided by supply $V_{SP}$. It has been empirically observed that capacitor $C_C$ provides better frequency compensation properties than that provided by capacitor $C_{COMP}$ of amplifier 10. An exemplary value for capacitor $C_C$ is 47 nF.

While the present invention has been particularly described with respect to the illustrated embodiment, it will be appreciated that various alterations, modifications and adaptations may be made based on the present disclosure, and are intended to be within the scope of the present invention. For example, a complementary version of the amplifying cells according to present invention may be constructed by, for example, replacing selected PNP transistors with NPN transistors, replacing selected NPN transistors with PNP transistors, and exchanging the potentials of selected supply lines. The general knowledge of constructing complimentary versions of analog circuits by such replace and exchange operations is well known to those skilled in the art. Additionally, although bipolar output transistors have been shown, other types of transistors may be used. Accordingly, it is to be understood that the present invention is not limited to the disclosed embodiment(s) but, on the contrary, is intended to cover various modifications and equivalent arrangements included within the scope of the appended claims.

What is claimed is:

1. An amplifying cell comprising:

a first input port for receiving a first input voltage signal, a second input port for receiving a second input voltage signal, and an output port;

an output transistor having a first terminal, a second terminal, and a control terminal, said first terminal coupled to said output port and said second terminal coupled to a first source of potential, said control terminal controlling the flow of current between said first and second terminals;

a differential amplifying network comprising a first input terminal coupled to said first input port, a second input terminal coupled to said second input port, and an output port coupled to said control terminal of said output transistor, and having an input voltage signal difference between said first and second input terminals, said amplifying network generating a current signal at its output as a function of said input voltage signal difference when said input voltage signal difference has a first polarity, and generating a substantially lower current signal at its output as a function of said difference when said difference has a second polarity opposite to said first polarity, said amplifying network further generating a quiescent output current at its output when the input voltage signal difference is substantially zero; and a bias network for generating a bias current and coupling said bias current to said control terminal of said output transistor such that the total quiescent current provided to said control terminal of said output transistor is less than the quiescent output current provided by said amplifying network;

wherein said amplifying network comprises a differential amplifier having inputs coupled to the respective signal inputs of said cell and an output, and a gain stage transistor having a base terminal coupled to the output of said differential amplifier and a collector terminal coupled to the control terminal of said output transistor.

2. The amplifier of claim 1 wherein said output transistor comprises a bipolar transistor having a collector terminal, a base terminal, and an emitter terminal, wherein said collector terminal is coupled to said output port and said emitter terminal is coupled to said first source of potential.

3. The amplifying cell of claim 1 wherein said output transistor generates a quiescent output current at its first terminal in relation to the total quiescent current provided to its control terminal, wherein said differential amplifying network and said output transistor are collectively capable of generating a predetermined maximum output current at the first terminal of said output transistor, and wherein the quiescent output current of said output transistor is in the range of approximately 0.025% to approximately 2% of said maximum output current.

4. The amplifying cell of claim 1 wherein said output transistor generates a quiescent output current at its first terminal in relation to the total quiescent current provided to its control terminal, and wherein the quiescent output current of said output transistor is in the range of approximately 10 µA to approximately 100 µA.

5. The amplifying cell of claim 2 wherein said output transistor has a quiescent base-emitter voltage when the input signal difference is substantially zero, and wherein said bias current has a value which sets said quiescent base-emitter voltage of said output transistor in the range of approximately 0.60 volts to approximately 0.65 volts.

6. The amplifying cell of claim 1 wherein said bias current is coupled to said control terminal of said output transistor such that it cancels with a portion of the quiescent output current from said amplifying network.

7. The amplifying cell of claim 1 further comprising means for reducing the magnitude of said bias current when the input signal difference is positive.

8. The amplifying cell of claim 1 wherein said bias network comprises a current mirror.

9. The amplifying cell of claim 8 wherein said current mirror comprises a first transistor having its collector terminal coupled to the control terminal of said output transistor, a second transistor coupled to said first transistor to establish a current in said first transistor, and a schottky barrier diode coupled between the base and collector terminals of said first transistor.

10. The amplifying cell of claim 1 wherein said differential amplifier comprises a differential pair of transistors of a first bipolar transistor type, wherein the transistors of said differential pair have their base terminals coupled to respective inputs of said amplifier network, wherein one of said transistors of said differential pairs has its collector terminal coupled to the base terminal of said gain stage transistor, and wherein said gain stage transistor comprises a second bipolar transistor type complementary to said first type.

11. The amplifying cell of claim 10 wherein said differential amplifier further comprises:

a current-mirror load comprising two transistors of a second bipolar type complimentary to said first type, said current-mirror transistors having their collector terminals coupled to respective collector terminals of said differential pair transistors, one of said transistors of said current mirror load having its collector terminal coupled to the base terminal of said gain stage transistor; and a schottky barrier diode coupled between the base and collector terminals of the one of said current-mirror transistors having its output coupled to gain stage transistor.

12. An amplifying cell comprising:

a first input port for receiving a first input voltage signal, a second input port for receiving a second input voltage signal, and an output port;

an output transistor having a first terminal, a second terminal, and an control terminal, said first terminal coupled to said output port and said second terminal coupled to a first source of potential, said control terminal controlling the flow of current between said first and second terminals;

a differential amplifying network comprising a first input terminal coupled to said first input port, a second input terminal coupled to said second input port, and an output coupled to said control terminal of said output transistor, and having an input voltage signal difference between said first and second input terminals, said amplifying network generating a current signal at its output as a function of said input voltage signal difference when said input voltage signal difference has a first polarity, and generating a substantially lower current signal at its output as a function of said difference when said difference has a second polarity opposite to said first polarity, said amplifying network further generating a quiescent output current at its output when the input voltage signal difference is substantially zero, said amplifying network further comprising a differential pair of transistors of a first bipolar transistor type, a current-mirror load comprising two transistors of a second bipolar transistor type complementary to said first type, and a first resistance, said transistors of said differential pair having their base terminals coupled to respective inputs of said amplifier network and their collector terminals coupled to respective collector terminals of said current-mirror transistors, the output of said differential amplifier being provided at the collector of a first one of said two current-mirror transistors, said first resistance being coupled in series with the emitter terminal of a second one of said two current-mirror transistors such that said first resistance reduces the magnitude of the quiescent output current of said amplifying network; and a bias network for generating a bias current and for coupling said bias current to said control terminal of said output transistor such that the total quiescent current provided to said control terminal of said output transistor is greater than the quiescent output current provided by said amplifying network.

13. The amplifying cell of claim 12 wherein said differential amplifier further comprises a second resistance coupled in series with said emitter terminal of said first one of said two current-mirror transistors, and wherein said first resistance comprises means for adjusting its value.

14. The amplifier cell of claim 12 wherein said quiescent output current of said amplifier network and said bias current combine as a total quiescent current provided to the control terminal of said output transistor, said total quiescent current having a magnitude greater than either of said quiescent output current of said amplifier network and said bias current.

15. The amplifier of claim 12 wherein said output transistor comprises a bipolar transistor having a collector terminal, a base terminal, and an emitter terminal, wherein said collector terminal is coupled to said output port and said emitter terminal is coupled to said first source of potential.

16. The amplifying cell of claim 12 wherein said output transistor generates a quiescent output current at its first terminal in relation to the total quiescent current provided to its control terminal, wherein said differential amplifying network and said output transistor are collectively capable of generating a predetermined maximum output current at the first terminal of said output, transistor, and wherein the quiescent output current of said output transistor is in the range of approximately 0.025% to approximately 2% of said maximum output current.

17. The amplifying cell of claim 12 wherein said output transistor generates a quiescent output current at its first terminal in relation to the total quiescent current provided to its control terminal, wherein the quiescent output current of said output transistor is in the range of approximately 10 µA to approximately 100 µA.

18. The amplifying cell of claim 15 wherein said output transistor has a quiescent base-emitter voltage when the input signal difference is substantially zero, and wherein the quiescent base-emitter voltage of said output transistor in the range of approximately 0.60 volts to approximately 0.65 volts.

19. The amplifying cell of claim 12 wherein said amplifying network further comprises a gain stage transistor having a base terminal coupled to the output of said differential amplifier and a collector terminal coupled to the control terminal of said output transistor.

20. The amplifying cell of claim 19 wherein said gain stage transistor comprises a second bipolar transistor type complementary to said first type.

21. The amplifying cell of claim 12 wherein said differential amplifier further comprises a schottky barrier diode coupled between the base and collector terminals of said first one of said current-mirror transistors.

22. An amplifier comprising:

an input port for receiving an input voltage signal which cycles about a reference level; and two transconductance cells, each of said cells including an input coupled to said input voltage signal and an output, one of said cells generating a current in relation to said input voltage signal at its output when said input voltage signal is at a level above said reference, and the other of said cells generating a current in relation to said input voltage signal at its output when said input voltage signal is at a level below said reference level, each of said cells comprising:

a differential amplifying network comprising a first input coupled to said input signal, a second input coupled to said reference level, and an output, said amplifying network generating a quiescent output current at its said output when the signals at said inputs are substantially the same level;

an output transistor having a collector terminal coupled to said output of said cell and a base terminal coupled to said output of said differential amplifier such that said output transistor may receive said quiescent output current of said differential amplifying network; and a bias network for generating a bias current and for coupling said bias current to said base terminal of said output transistor such that the quiescent output current of said output transistor may be set to a desired value; wherein a maximum supply voltage within said amplifier is no greater than 2.0 V.

* * * * *